United States Patent
De Weerdt et al.

(10) Patent No.: US 12,189,011 B2
(45) Date of Patent: Jan. 7, 2025

(54) ADAPTIVE RECONSTRUCTION OF MAGNETIC RESONANCE IMAGES

(71) Applicant: KONINKLIJKE PHILIPS N.V., Eindhoven (NL)

(72) Inventors: Elwin De Weerdt, Tilburg (NL); Nicola Pezzotti, Eindhoven (NL)

(73) Assignee: Koninklijke Philips N.V., Eindhoven (NL)

(*) Notice: Subject to any disclaimer, the term of this patent is extended or adjusted under 35 U.S.C. 154(b) by 415 days.

(21) Appl. No.: 17/778,899

(22) PCT Filed: Nov. 20, 2020

(86) PCT No.: PCT/EP2020/082808
§ 371 (c)(1),
(2) Date: May 23, 2022

(87) PCT Pub. No.: WO2021/105011
PCT Pub. Date: Jun. 3, 2021

(65) Prior Publication Data
US 2022/0413076 A1     Dec. 29, 2022

(30) Foreign Application Priority Data
Nov. 28, 2019  (EP) .................................. 19212205

(51) Int. Cl.
*G06V 10/00*     (2022.01)
*G01R 33/48*     (2006.01)
(Continued)

(52) U.S. Cl.
CPC ..... *G01R 33/5608* (2013.01); *G01R 33/4822* (2013.01); *G01R 33/4835* (2013.01); *G06N 3/08* (2013.01)

(58) Field of Classification Search
CPC ............ G06N 3/08; G06N 3/02; G06N 3/042; G06N 3/045; G06N 3/047; G06N 3/049;
(Continued)

(56) References Cited

U.S. PATENT DOCUMENTS

| 7,542,622 B1 * | 6/2009 | Angelini | G06T 5/70 |
| | | | 382/275 |
| 10,241,173 B2 * | 3/2019 | Zhao | G01R 33/50 |

(Continued)

FOREIGN PATENT DOCUMENTS

JP     2014018571 A     2/2014

OTHER PUBLICATIONS

H. Takeshima "Integrated Spatial and Temporal Correlation Into a Deep Neural Network for Low-Delay Reconstruction of Highly Undersampled Radial Dynamic Ranges" ISMRM 2018 p. 2796.
(Continued)

*Primary Examiner* — Amir Alavi

(57) ABSTRACT

The present disclosure relates to a method comprising: providing a trained machine learning model. The trained machine learning model is configured for reconstructing images from input data. The method comprises: receiving (201) a multidimensional array comprising M dimensional acquired data; determining (205) a subset of values of at least one K selected dimension of the array; for each value of the subset determining (207) a M−K dimensional array comprising the acquired data corresponding to the value, resulting in a set of M−1 dimensional arrays; inputting (209) the set of M−K dimensional arrays to the trained machine learning model, and receive a reconstructed image from the trained machine learning model.

10 Claims, 3 Drawing Sheets

(51) Int. Cl.
 *G01R 33/483* (2006.01)
 *G01R 33/56* (2006.01)
 *G06N 3/08* (2023.01)

(58) Field of Classification Search
 CPC ...... G06N 3/082; G06N 3/092; G06N 3/0457; G06N 3/0454; G06N 3/0464; G01R 33/5608; G01R 33/4822; G01R 33/4835; G06T 2207/20081; G06T 2207/20084
 See application file for complete search history.

(56) References Cited

U.S. PATENT DOCUMENTS

| | | | |
|---|---|---|---|
| 10,346,986 B2 | 7/2019 | Xu et al. | |
| 10,989,779 B2 * | 4/2021 | Hyun | G06T 7/0014 |
| 11,181,598 B2 * | 11/2021 | Polak | A61B 5/055 |
| 11,210,786 B2 * | 12/2021 | Min | A61B 5/0075 |
| 11,360,176 B2 * | 6/2022 | Polak | G16H 50/20 |
| 11,610,346 B2 * | 3/2023 | Atria | G06T 7/0012 |
| 11,835,613 B2 * | 12/2023 | Mailhe | G01R 33/5611 |
| 12,023,102 B2 * | 7/2024 | Gutierrez | G06N 20/00 |
| 12,067,652 B2 * | 8/2024 | Schuelke | G06N 3/084 |
| 2019/0336033 A1 | 11/2019 | Takeshima | |
| 2021/0065413 A1 * | 3/2021 | Huang | G16H 30/40 |
| 2022/0065970 A1 * | 3/2022 | Nickel | G06T 7/0016 |

OTHER PUBLICATIONS

Jo Schlemper et al "A Deep Cascade of Convolutional Neural Networks for Dynamic MR Image Reconstruction" Apr. 8, 2017 Cornell University Library.
Cheng Peng et al "Deep Slice Interpolation Via Marginal Super-Resolution, Fusion and Refinement" Aug. 15, 2019, p. 4-5.
International Search Report and Written Opinion from PCT/EP2020/082808 mailed Feb. 3, 2021.

* cited by examiner

ADAPTIVE RECONSTRUCTION OF MAGNETIC RESONANCE IMAGES

CROSS REFERENCE TO RELATED APPLICATIONS

This application is a U.S. national phase application of International Application No. PCT/EP2020/082808 filed on Nov. 20, 2020, which claims the benefit of EP application Ser. No. 19/212,205.9 filed on Nov. 28, 2019 and is incorporated herein by reference.

FIELD OF THE INVENTION

The invention relates to scanning imaging systems, in particular to a medical analysis system for reconstructing magnetic resonance images.

BACKGROUND OF THE INVENTION

Magnetic resonance imaging (MRI) scanners rely on a large static magnetic field (BO) to align the nuclear spins of atoms as part of the procedure for producing images within the body of a patient. These images can reflect various quantities or properties of the subject. Image reconstruction from undersampled k-space data is playing an important role for MRI. In particular, deep learning has shown potential to significantly speed up MRI reconstruction with reduced measurements. The ISMRM-2018 abstract (p. 2796): 'Integrating spatial and temporal correlation into a deep neural network for low-delay reconstruction of highly undersampled radial dynamic images' by H. Takeshima discloses a dynamic reconstruction method using a deep neural network (DNN) in which from consecutive M frames of and N neighbouring slices a single image is reconstructed.

SUMMARY OF THE INVENTION

Various embodiments provide for a medical analysis system for reconstructing magnetic resonance images, method, and computer program product, as described by the subject matter of the independent claims. Advantageous embodiments are described in the dependent claims.

Embodiments of the invention may provide for means for reconstructing an actual (center) line, slice or slab wherein account is taken of correlations with adjacent lines, slices or slabs respectively. The invention may achieve to reduce the dimensionality of an optimization problem in reconstruction which reduces the computational effort and time for MR image reconstruction. This may be achieved by reducing the dimension of a multidimensional array of dimension M of MR image data by one or more dimensions (K>=1 dimensions), resulting in reduced arrays of dimension M−K (M minus K), selecting one or more subparts of the reduced arrays, wherein each subpart comprises correlated arrays, and using the subpart as input to a model that has been trained for reconstructing images from data having that lowered dimension M−K.

In one aspect, the invention relates to a medical analysis system for reconstructing magnetic resonance images. The medical analysis system comprises a processor and at least one memory storing machine executable instructions. The processor is configured for controlling the medical analysis system. The medical analysis system comprises a trained machine learning model, wherein the trained machine learning model is configured for reconstructing MR images from input data. Execution of the machine executable instructions causes the processor to: receive a multidimensional array comprising M-dimensional acquired data, determine a subset of values of at least one selected dimension of the M-dimensional array (K selected dimensions where K>=1 and K<M), for each value of each subset of the at least one subset determine an M−K dimensional array comprising the acquired data corresponding to the values, resulting in a set of M−K dimensional arrays, input the set of M−K dimensional arrays to the trained machine learning model, and receive an image reconstruction output from the trained machine learning model.

For example, if two dimensions are selected i.e. K=2, two subsets of values may be determined, one subset per selected dimension. For each pair of a first value of one of the two subsets and a second value of the other subset of the two subsets, an M−2 dimension array may be determined. E.g. if the first subset has two values and the second subset has three values, six possible pairs may be defined from the two subsets and thus six M−2 arrays may be determined for the six pairs. If three dimensions are selected i.e. K=3, three subsets of values may be determined, one subset per selected dimension. For each triplet of a first value of one of the three subsets and a second value and third values of the two other subsets of the three subsets, an M−3 dimension array may be determined. For example, if one dimension is selected i.e. K=1, one subset of values may be determined. For each value of the subset, an M 1 dimension array may be determined and so on.

Trained models such as deep learning models may perform increasingly better when increasing the dimensionality of a problem. For example, a 3D problem may be solved by processing a 3D undersampled Cartesian scan using a pure 3D reconstruction. This may yield better image quality than solving the 3D problem slice by slice (i.e. N times a 2D problem). However, solving N times a 2D problem may be more practical than solving the entire 3D problem in one go. This may be more practical in terms of computation time and memory, during training and inference, thereby allowing, for example, for application of more powerful deep learning solutions.

The present subject matter may enable to break a M dimensional problem into a plurality of M−K dimensional problems. An example is accelerated Cartesian 3D scanning where the k-space is fully measured in read-out direction. The latter allows for splitting of the optimization problem along the read-out direction, hence breaking a 3D reconstruction problem into Nread_out times a 2D problem. By breaking the problem into smaller problems, trained machine learning models may have to cope with less data and hence may lower the computation and memory load. The computational load and memory consumption may be important elements during inference (e.g. during image reconstruction on the scanner) and during training. This may particularly be advantageous for deep neural networks for the following reasons. The network(s) size(s) within a deep learning solution is limited by hardware constraints (e.g. the availability of the GPU memory of compute power) during training and on the scanner. Since the performance in terms of output quality typically goes up with an increase in a model size, it may be beneficial to use as large as possible networks. Solving smaller problems may hence allow for the use of larger models and hence increase the output quality. The present subject matter may further optimize a solution of the reduced plurality of M−K dimensional problems. In particular, the present subject matter may employ a 'N and a half' D approach to solve a M dimensional problem (for M=3 the approach may be a 2.5D approach) using correlations between the N (M−K) dimensional data. By using information of a few correlated slabs or slices (e.g. neighbouring 2D slices may be correlated slices) instead of the whole M dimensional volume, the correlations between slices or slabs can be used to improve the image quality of the actual single slice or slab. This 'N and a half' D approach may be used for a situation where the problem can be separated along one or more dimensions.

For example, an MRI scanner may be used for scanning or imaging a target volume (e.g. brain) in a subject in order to acquire data. This may result in the M-dimensional acquired data. The acquired data may comprise k-space data (e.g. undersampled k-space data) or other image data such as aliased image data. k-space data may be defined herein as being the recorded measurements of radio frequency signals emitted by atomic spins using an antenna of a magnetic resonance apparatus during a magnetic resonance imaging scan.

The trained machine learning model may be configured to provide an image reconstruction output in response to receiving a set of X-dimensional arrays of data. The image reconstruction output is the result of reconstructing image data of one single X-dimensional (XD) array of the set of X dimensional arrays and taking into account the correlation between the single XD array and the remaining XD arrays of the set of XD arrays. The X dimension is provided so that M−K=X. The machine learning model may be trained to directly learn the mapping between the input (e.g. undersampled k-space data or aliased images) and output MR images. The image reconstruction output may, for example, be a magnetic resonance image such as a reconstructed one-, two-, or three-dimensional visualization of anatomic data contained within the k-space data. For example, the undersampled k-space data is used as the input of the trained machine learning model and a desired image from the fully sampled k-space data may be the reconstructed image output.

Each array of the set of M−K arrays may comprise at least one dimension that represents the spatial frequency information in one of the three directions of an object. According to one embodiment, K=1 so that one dimension is selected and one subset of values along the selected dimension is determined.

According to one embodiment, execution of the machine executable instructions further causes the processor to determine the subset of values so that a correlation between the M−K dimensional array associated with a value (or a given value) of the subset and a remaining M−K dimensional arrays of the set is higher than a predefined threshold.

The correlations along dimensions can be very strong, especially in a local fashion (e.g. neighbouring slices), hence it can limit the output quality if they are not taken into account.

This embodiment may enable to solve a partial multidimensional problem where the data of all dimensions are not completely taken into account but only 'local' data is taken into account, i.e. when optimizing for a particular multidimensional problem for a point in the (M−K) dimensions, the data in the neighbourhood of that point is also given as input to the trained machine learning model. For example, instead of passing data for a single point in read-out direction (e.g. passing a single ky/kz space), the data for a range in read-out direction is supplied to the trained machine learning model. The output of the trained machine learning model may still be the solution to the original multidimensional problem, but now the machine learning model can take advantage of the (local) correlations that exist along the read-out direction.

The correlation between the M−K dimensional arrays may for example be position dependent. For example, 2D adjacent slices of a 3D acquisition may be highly correlated because of missing inter-slice gaps. In particular, adjacent 2D slices may be very similar due to the slow spatial variations of the scanned object. For example if M=3, and a 3D k-space k(x, y, z) array is provided with the selected dimension being x (and x=x1, x2, x3 . . . ), the slices k(x1, y, z), k(x2, y, z) and k(x3, y, z) which correspond to the consecutive values x1, x2 and x3 may be correlated slices. The 2D slices k(x1, y, z), k(x2, y, z) and k(x3, y, z) may thus be the set of two dimensional arrays. In another example, if M=4, and 4D k-space k(x, y, z, t) array is provided with the selected dimension being time t (and t=t1, t2, t3 . . . ), the 3D slabs k(x, y, z, t1) and k(x, y, z, t4) may be the correlated set of three dimensional arrays. The correlation may occur between slabs that are acquired at different point of times which are not necessarily consecutive points of times. For instance, when dealing with cardiac imaging, the correlation is strongest between neighbouring phases in the cardiac cycle which may not be measured consecutively in time.

According to one embodiment, execution of the machine executable instructions further causes the processor to determine further subsets of values and to repeat the step d) of determining an M−K dimensional array and the inputting step e) for each further subset of the further subsets. The steps d) and e) may be repeated so that the image reconstruction output may be provided for each M−K dimensional array of the M dimensional array. For example, if M=3 and K=1, each 2D slice along the selected dimension may be input to the trained machine learning model together with one or more slices which are correlated with the each 2D slice e.g. if the number of 2D slices along the selected dimension is 100, steps d) and e) may be repeated 100 times resulting in 100 reconstructed image output (2D slice image).

According to one embodiment, the subsets being non-overlapping subsets. This may further save processing resources while still providing an accurate reconstruction result. For example, if M=3 and K=1, only one slice of the correlated slices of the subset of 2D slices may be reconstructed and may represent all slices of the subset. If the number of 2D slices along the selected dimension is 100, steps d) and e) may be repeated a number of times (which is the number of all subsets of values of the selected dimension) smaller than 100 e.g. if the first selected subset has 3 slices, the next subset may be selected from the remaining 100—3 slices, if the next subset comprise 5 slices, a next subset may be selected from the remaining 100—8 slices and so on.

According to one embodiment, the M dimensional acquired data is 3D k-space data (M=3), wherein the selected dimension is a read-out direction (K=1), wherein the set of M−1 dimensional arrays are representing a respective set of 2D slices.

For example, M=3 dimensions correspond to the spacial dimensions kx, ky and kz of k-space. The 3D acquired data may be k-space data.

This embodiment may be advantageous for the following reason. The present subject matter may be used with a limited memory on a GPU by using a 2D neural network model to squeeze the most performance out of the 2D neural network. This is because, using a 3D neural network model may quickly run into memory issues when passing a full image or patches through the 3D neural network.

According to one embodiment, the subset of values comprises a predefined odd number of values. This may enable to obtain highly correlated slices in particular if the actual value is the centre value of the determined subset. In another example, the subset of values may comprise a randomly selected number of values that is smaller than a predefined maximum number.

According to one embodiment, determining the subset of values comprises identifying a centre value along the selected dimension and two or more surrounding values of the centre value. The subset comprises the centre value and the surrounding values. This may enable a systematic way of selecting the subset which may further improve the execution performance of the present subject matter. This may particularly be advantageous as adjacent slices may be highly correlated.

According to one embodiment, the trained machine learning model is a deep neural network (DNN) model. For example, the input layer of the DNN comprising nodes, each node of the nodes being configured to receive a value of an element of one of the sets of M−K dimensional arrays. In another example, the trained machine learning model may be a ISTA-net model. This may enable a fast reconstruction of magnetic resonance images with the use of deep learning neural networks from sparsely sampled MR-data in k-space.

In another aspect, the invention relates to a method comprising: providing a trained machine learning model, the trained machine learning model being configured for reconstructing images from input k-space data; receiving a multidimensional array comprising M dimensional acquired data; determining a subset of values of K selected dimensions of the array, where K is an integer number higher than or equal to one and smaller than M; for each value of the subset determining a M−K dimensional array comprising the acquired data corresponding to the value, resulting in a set of M−K dimensional arrays; inputting the set of M−K arrays to the trained machine learning model, and receiving a reconstructed image from the trained machine learning model.

In another aspect, the invention relates to a computer program product comprising machine executable instructions for execution by a processor, wherein execution of the machine executable instructions causes the processor to the methods of any of the preceding embodiments.

In one aspect, the invention relates to a medical analysis system for reconstructing magnetic resonance images. The medical analysis system comprises a processor and at least one memory storing machine executable instructions. The processor is configured for controlling the medical analysis system. The medical analysis system comprises a trained machine learning model, wherein the trained machine learning model is configured for reconstructing images from input data. Execution of the machine executable instructions causes the processor to: receive an dimensional array comprising M multi-dimensional acquired data, determine a subset of values of a selected dimension of the M dimensional array, for each value of the subset determine an M−1 dimensional array comprising the acquired data corresponding to the value, resulting in a set of M−1 dimensional arrays, input the set of M−1 dimensional arrays to the trained machine learning model, and receive an image reconstruction output from the trained machine learning model.

It is understood that one or more of the aforementioned embodiments of the invention may be combined as long as the combined embodiments are not mutually exclusive.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

In the following, like numbered elements in the figures are either similar elements or perform an equivalent function. Elements which have been discussed previously will not necessarily be discussed in later figures if the function is equivalent.

Various structures, systems and devices are schematically depicted in the figures for purposes of explanation only and so as to not obscure the present invention with details that are well known to those skilled in the art. Nevertheless, the attached figures are included to describe and explain illustrative examples of the disclosed subject matter.

Figure 1:
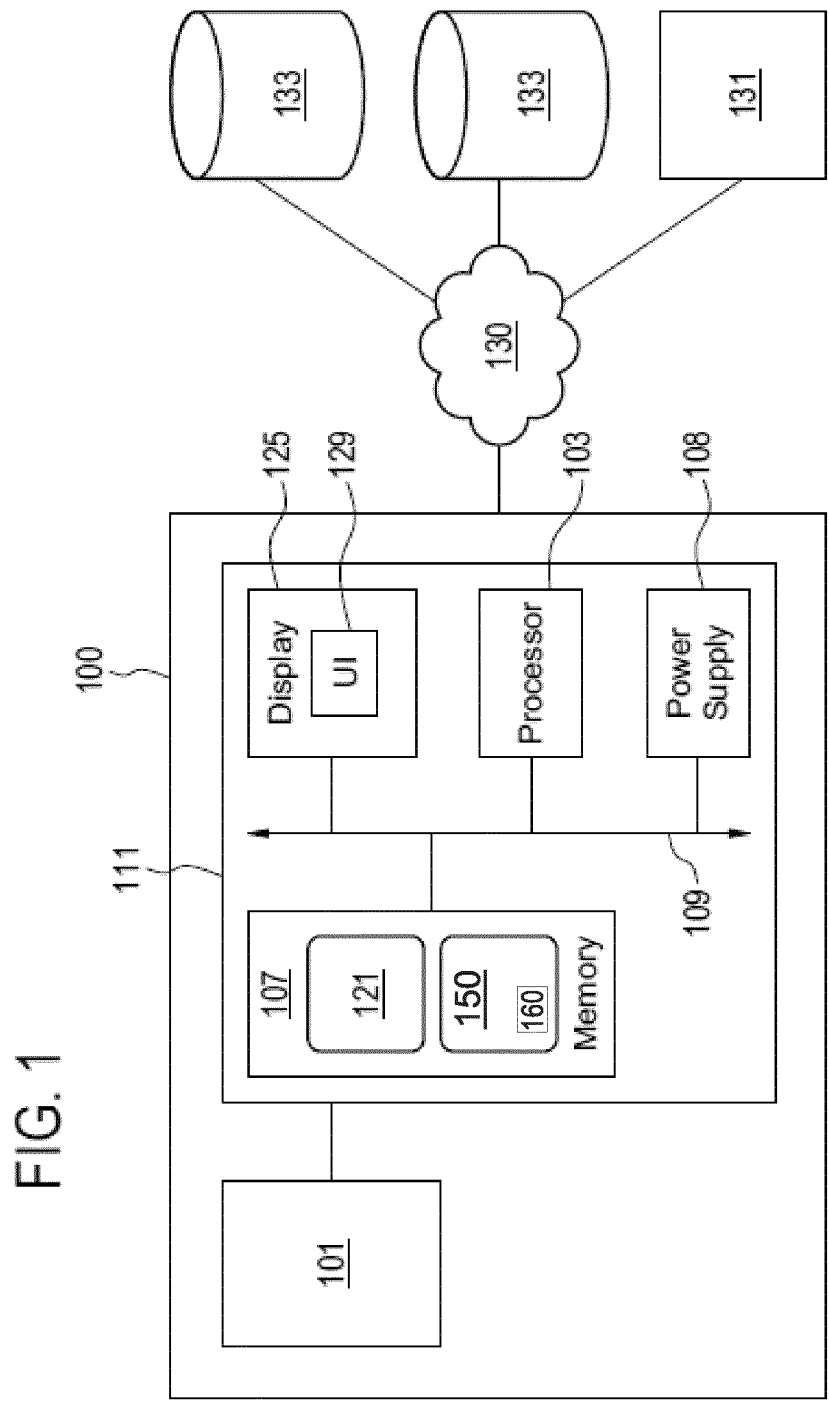
FIG. 1 is a schematic diagram of a control system in accordance with the present subject matter.

FIG. 1 is a schematic diagram of a medical analysis system 100. The medical analysis system 100 comprises a control system 111 that is configured to connect to a scanning imaging system (or acquisition component) 101. The control system 111 comprises a processor 103, a memory 107 each capable of communicating with one or more components of the medical system 100. For example, components of the control system 111 are coupled to a bidirectional system bus 109.

It will be appreciated that the methods described herein are at least partly non-interactive, and automated by way of computerized systems. For example, these methods can further be implemented in software 121, (including firmware), hardware, or a combination thereof. In exemplary embodiments, the methods described herein are implemented in software, as an executable program, and is executed by a special or general-purpose digital computer, such as a personal computer, workstation, minicomputer, or mainframe computer.

The processor 103 is a hardware device for executing software, particularly that stored in memory 107. The processor 103 can be any custom made or commercially available processor, a central processing unit (CPU), an auxiliary processor among several processors associated with the control system 111, a semiconductor based microprocessor (in the form of a microchip or chip set), a micro-processor, or generally any device for executing software instructions. The processor 103 may control the operation of the scanning imaging system 101.

The memory 107 can include any one or combination of volatile memory elements (e.g., random access memory (RAM, such as DRAM, SRAM, SDRAM, etc.)) and nonvolatile memory elements (e.g., ROM, erasable programmable read only memory (EPROM), electronically erasable programmable read only memory (EEPROM), programmable read only memory (PROM). Note that the memory 107 can have a distributed architecture, where various components are situated remote from one another, but can be accessed by the processor 103. Memory 107 may store an instruction or data related to at least one other constituent element of the medical analysis system 100.

The control system 111 may further comprise a display device 125 which displays characters and images and the like e.g. on a user interface 129. The display device 125 may be a touch screen display device.

The medical analysis system 100 may further comprise a power supply 108 for powering the medical analysis system 100. The power supply 108 may for example be a battery or an external source of power, such as electricity supplied by a standard AC outlet.

The scanning imaging system 101 may comprise at least one of MRI, CT and PET-CT imagers. The control system 111 and the scanning imaging system 101 may or may not be an integral part. In other terms, the control system 111 may or may not be external to the scanning imaging system 101.

Figure 4:
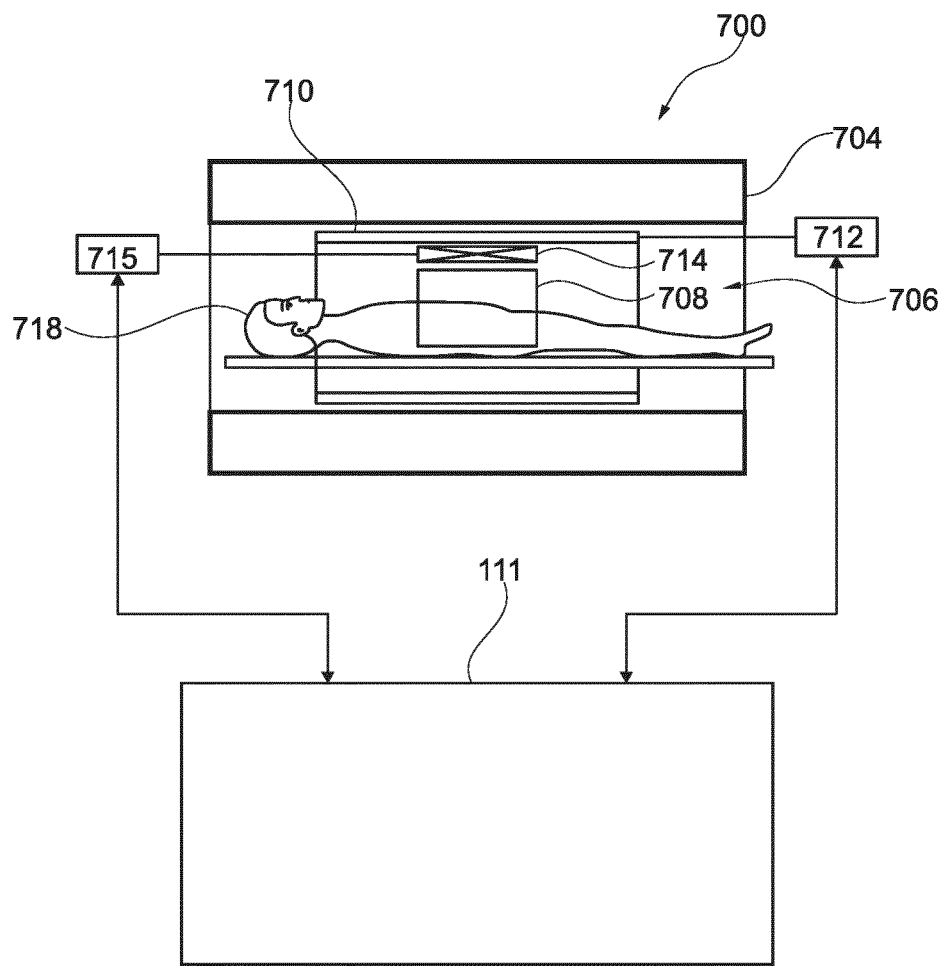
FIG. 4 shows a cross-sectional and functional view of an MRI system.

The scanning imaging system 101 comprises components that may be controlled by the processor 103 in order to configure the scanning imaging system 101 to provide image data to the control system 111. The configuration of the scanning imaging system 101 may enable the operation of the scanning imaging system 101. The operation of the scanning imaging system 101 may for example be automatic. FIG. 4 shows an example of components of the scanning imaging system 101 being an MRI system.

The connection between the control system 111 and the scanning imaging system 101 may for example comprise a BUS Ethernet connection, WAN connection, or Internet connection etc.

In one example, the scanning imaging system 101 may be configured to provide output data such as images in response to a specified measurement. The control system 111 may be configured to receive data such as MR image data from the scanning imaging system 101. For example, the processor 103 may be adapted to receive information (automatically or upon request) from the scanning imaging system 101 in a compatible digital form so that such information may be displayed on the display device 125. Such information may include operating parameters, alert notifications, and other information related to the use, operation and function of the scanning imaging system 101.

The medical analysis system 100 may be configured to communicate via a network 130 with other scanning imaging systems 131 and/or databases 133. The network 130 comprises for example a wireless local area network (WLAN) connection, WAN (Wide Area Network) connection LAN (Local Area Network) connection or a combination thereof. The databases 133 may comprise information relates to patients, scanning imaging systems, anatomies, scan geometries, scan parameters, scans etc. The databases 133 may for example comprise an electronic medical record (EMR) database comprising patients' EMR, Radiology Information System database, medical image database, PACS, Hospital Information System database and/or other databases comparing data that can be used for planning a scan geometry. The databases 133 may for example comprise training datasets for the training performed by the present subject matter.

The memory 107 may further comprise an artificial intelligence (AI) component 150. The AI component 150 may or may not be part of software component 121. The AI component 150 may for example comprise a trained machine learning model 160. The trained machine learning model 160 may be configured to receive a set of X dimensional arrays and to provide an image reconstruction output that represents one of the set of arrays e.g. the set of X dimensional arrays may comprise 3 arrays Arr1, Arr2, and Arr3, wherein the trained model may reconstruct an image output of one array Arr1 of the arrays, while the other arrays Arr2 and Arr3 may be used for taking into account, in the reconstruction, their correlation with Arr1. Thus, the three arrays may be input to the trained models in order to receive an image reconstruction output of the array Arr1. The image reconstruction output may be a subset or portion of a final output. For example, the image reconstruction output may be a range of images out of the total volume. There may be a mapping of a subrange of M dimensions input to a subrange of the P dimensional output.

The machine learning model 160 may for example be trained by providing multiple sets of XD arrays, and associating each set of X dimensional arrays with a fully sampled k-space reconstructed image that corresponds to the array (Arr1) of the set of X dimensional arrays.

Figure 2:
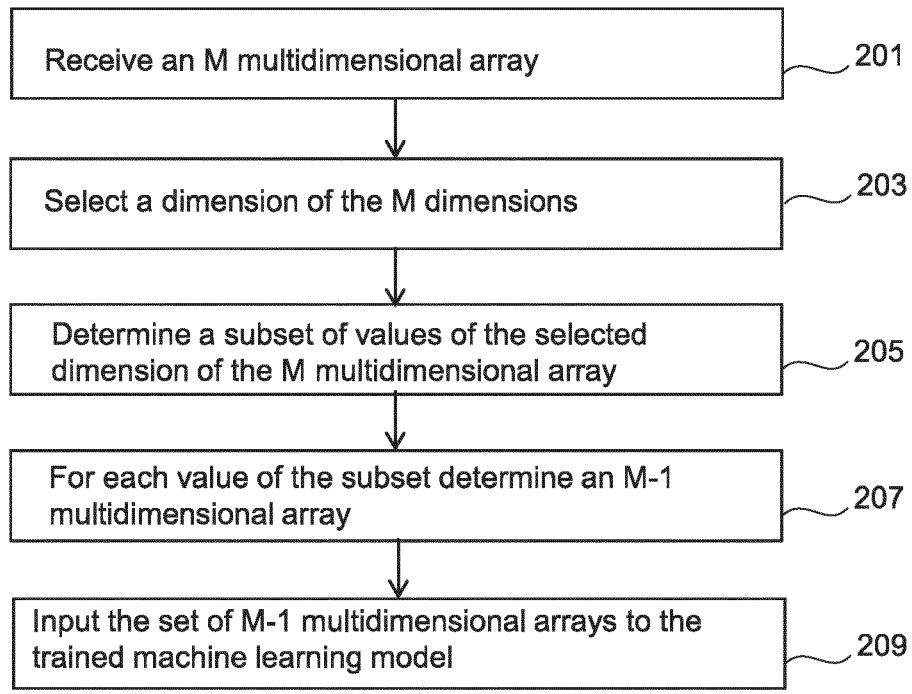
FIG. 2 is a flowchart of a method for reconstructing magnetic resonance images in accordance with an example of the present subject matter.

FIG. 2 is a flowchart of a method for reconstructing magnetic resonance images of a target volume such as a brain of a subject. A MM system (e.g. as shown in FIG. 4) may be configured to acquire data by scanning or imaging a target volume of a subject.

An M dimensional array comprising acquired data (by the MM system) may be received in step 201. The acquired data may for example be k-space data or other image data such as aliased image data. The acquired data may for example comprise at least one dimension that represents one of the three directions of the target volume. The M dimensions may comprise further dimensions such as a time dimension. In one example, $M>=2$.

Assuming for simplification of the description that $M=3$ which corresponds to the spacial dimensions e.g. kx, ky and kz. In this case, the M dimensional array may, for example, be defined as mr(x, y, z), wherein x has a number of Sx values, y has Sy values and z has Sz values i.e. the array mr has a size of $Sx*Sy*Sz$.

At least one dimension of the M dimensions may be selected or identified in step 203 (i.e. K dimensions may be selected where $K>=1$). $K=1$ in this example, but it is not limited to. For example, the selected dimension may be a user selected dimension e.g. a user input may be received. The user input indicates the selected dimension. In another example, an automatic selection of the dimension may be performed e.g. a random selection may be performed. For simplification of description, the selected dimension may be the dimension x of the array mr. The selected dimension has a respective set of values in the M dimensional array. The set of values comprises Sx values, where Sx is, for example, the number of phase encodings in case the selected dimension is a dimension that corresponds to the phase encoding.

The dimension may be selected so that the M-1 dimensional arrays have dimension M-1=X, where X is the dimension of the set of arrays that are used as input to the trained machine learning model 160. Each array of the set of M-1 dimensional arrays may comprise at least one dimension that represents the spatial frequency information in one of the three directions of the target volume.

A subset of values of the set of values may be determined in step 205. Following the above example, the subset of values may for example be a subset of the Sx values. The subset of values may be determined as follows: select a first value (or current value) of the subset from the set of Sx values, and further select the remaining values of the subset. The remaining values and the current value may or may not form a range (they are consecutive values of the array). In one example, the remaining values may be chosen so that the current value is the center value. Assuming for example that the set of values are provided in the following order: v1, v2, v3, ... vSx. If the current value is v4, the remaining values may be v3 and v5 or may be v2, v3, v5 and v6, wherein v4 is the center value of the subset defined by v3, v4 and v5 or by v2, v3, v4, v5 and v6. If in one example, the current value being processed is the first value v1 (or last value vSx) the determined subset may comprise v1 and values beyond v1 such as v2 and v3.

Each value vx of the set of Sx values may define a 2D array mrx(y, z) associated with the value vx. The 2D array mrx(y, z) may represent a 2D slice at the value vx. For example, value v4 may be associated with 2D array mr4(y, z), v3 may be associated with 2D array mr3(y, z) and v2 may be associated with 2D array mr2(y, z) and so on. In one example, the remaining values associated with each current value may be determined by determining the correlations between the 2D array of each value of the remaining values with the 2D array of the current value. Following the above example, if the current center value is v4, the method may determine for each value of the values v1 to vSx (excluding v4) a correlation value between the 2D array associated with the each value and the 2D array mr4(y, z). Only values vx associated with a correlation value higher than a predefined threshold may be chosen. Those chosen values and the current value may form the subset.

In one example, the subset of values may comprise a predefined number of values e.g. 3. That is, the subset may comprise a current center value and the surrounding two values. This may be advantageous as it may enable an optimal selection method while still considering the correlation between the remaining values and the center value.

For each value of the subset, an M−1 dimensional array comprising the acquired data corresponding to the value may be determined in step 207. This may result in a set of M−1 dimensional arrays. Following the above example, if the determined subset of step 205 is [v3, v4, v5], the three arrays mr3(y, z), mr4(y, z) and mr5(y, z) may be the determined M−1 dimensional arrays of the three values of the subset [v3, v4, v5] respectively.

The set of M−1 dimensional arrays may be input to the trained machine learning model 160 in order to receive in step 209 an output of a reconstructed image from the trained machine learning model. Following the above example, a 2D image of the 2D slice mr4(y, z) associated with the current value v4 may be reconstructed.

In one example, steps 205-209 may be repeated for further subsets of values of the selected dimension. Following the above example, the first execution of the present method may be performed for a value v1 of the set of values v1 to vSx. Steps 205-209 may be repeated for each value of the set of values v2 to Sx. This may result in Sx reconstructed 2D slices.

Figure 3:
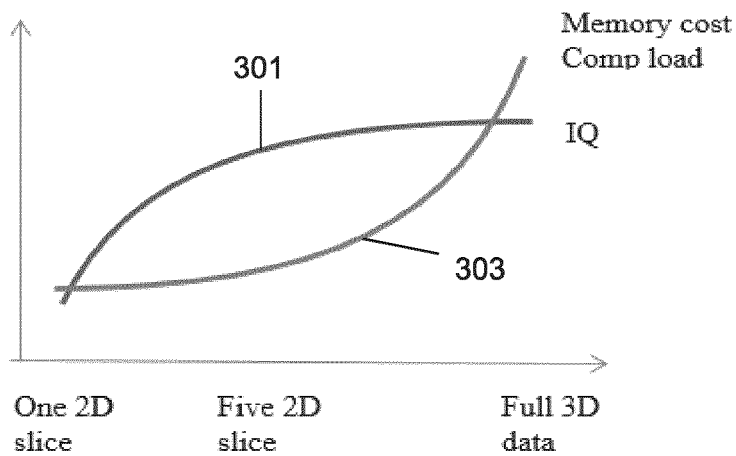
FIG. 3 depicts a graph illustrating excepted gain in image quality (IQ), increase in memory cost and computational load using the present subject matter.

FIG. 3 depicts a block diagram illustrating an excepted gain in increase in memory cost 301 and computational load 303, versus the input data size provided to the trained machine learning model. FIG. 3 shows three different input size namely one 2D slice, five 2D slices and a full 3D volume. FIG. 3 provides an illustration of the expected gain, 'costs' in term of memory, and computational load versus input data size.

FIG. 4 illustrates a magnetic resonance imaging system 700 as an example of the medical system 100. The magnetic resonance imaging system 700 comprises a magnet 704. The magnet 704 is a superconducting cylindrical type magnet with a bore 706 in it. The use of different types of magnets is also possible; for instance, it is also possible to use both a split cylindrical magnet and a so called open magnet or a sealed magnet. A split cylindrical magnet is similar to a standard cylindrical magnet, except that the cryostat has been split into two sections to allow access to the iso-plane of the magnet. Such magnets may for instance be used in conjunction with charged particle beam therapy. An open magnet has two magnet sections, one above the other with a space in-between that is large enough to receive a subject 718 to be imaged, the arrangement of the two sections area similar to that of a Helmholtz coil. Inside the cryostat of the cylindrical magnet there is a collection of superconducting coils. Within the bore 706 of the cylindrical magnet 704 there is an imaging zone or volume or anatomy 708 where the magnetic field is strong and uniform enough to perform magnetic resonance imaging.

Within the bore 706 of the magnet there is also a set of magnetic field gradient coils 710 which is used during acquisition of magnetic resonance data to spatially encode magnetic spins of a target volume within the imaging volume or examination volume 708 of the magnet 704. The magnetic field gradient coils 710 are connected to a magnetic field gradient coil power supply 712. The magnetic field gradient coils 710 are intended to be representative. Typically, magnetic field gradient coils 710 contain three separate sets of coils for the encoding in three orthogonal spatial directions. A magnetic field gradient power supply supplies current to the magnetic field gradient coils. The current supplied to the magnetic field gradient coils 710 is controlled as a function of time and may be ramped or pulsed.

MRI system 700 further comprises an RF coil 714 at the subject 718 and adjacent to the examination volume 708 for generating RF excitation pulses. The RF coil 714 may include for example a set of surface coils or other specialized RF coils. The RF coil 714 may be used alternately for transmission of RF pulses as well as for reception of magnetic resonance signals e.g., the RF coil 714 may be implemented as a transmit array coil comprising a plurality of RF transmit coils. The RF coil 714 is connected to one or more RF amplifiers 715.

The magnetic field gradient coil power supply 712 and the RF amplifier 715 are connected to a hardware interface of control system 111. The memory 107 of control system 111 may for example comprise a control module. The control module contains computer-executable code which enables the processor 103 to control the operation and function of the magnetic resonance imaging system 700. It also enables the basic operations of the magnetic resonance imaging system 700 such as the acquisition of magnetic resonance data.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a 'circuit', 'module' or 'system'. Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example, a data may be retrieved over a modem, over the interne, or over a local area network. Computer executable code embodied on a computer readable medium may be transmitted using any appropriate medium, including but not limited to wireless, wireline, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

A 'computer memory' or 'memory' is an example of a computer-readable storage medium. A computer memory is any memory which is directly accessible to a processor. A 'computer storage' or 'storage' is a further example of a computer-readable storage medium. A computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising 'a processor' should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object-oriented programming language such as Java, Smalltalk, C++ or the like and conventional procedural programming languages, such as the 'C' programming language or similar programming languages and compiled into machine executable instructions. In some instances, the computer executable code may be in the form of a high-level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block or a portion of the blocks of the flowchart, illustrations, and/or block diagrams, can be implemented by computer program instructions in form of computer executable code when applicable. It is further understood that, when not mutually exclusive, combinations of blocks in different flowcharts, illustrations, and/or block diagrams may be combined. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device'. A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, gear sticks, steering wheel, pedals, wired glove, dance pad, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bistable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word 'comprising' does not exclude other elements or steps, and the indefinite article 'a' or 'an' does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 medical system
101 scanning imaging system
103 processor
107 memory
108 power supply
109 bus
111 control system
121 software
125 display
129 user interface
133 databases
150 AI component
160 machine learning model
201-209 method steps
301 memory cost
303 computational load
700 magnetic resonance imaging system
704 magnet
706 bore of magnet
708 imaging zone
710 magnetic field gradient coils
712 magnetic field gradient coil power supply
714 radio-frequency coil
715 RF amplifier
718 subject

The invention claimed is:

1. A medical analysis system for reconstructing magnetic resonance images, the medical analysis system comprising a processor and at least one memory storing machine executable instructions, the processor being configured for controlling the medical analysis system, wherein execution of the machine executable instructions causes the processor to:
provide a trained machine learning model, the trained machine learning model being configured for reconstructing images from input data;
receive a M dimensional multidimensional array comprising M dimensional acquired data;
determine at least one subset of values of at least one selected dimension of the M dimensional array;
for each value of each of the at least one subset(s) determine an M−K dimensional array with K≥1 comprising the acquired data corresponding to the values, resulting in a set of M-K dimensional arrays;
input the set of M−K dimensional arrays to the trained machine learning model, and receive an image reconstruction output from the trained machine learning model and wherein execution of the machine executable instructions further causes the processor to determine the subset of values so that the correlation between the M−K dimensional array associated with a center value of the subset and the remaining M−K dimensional arrays of the set is higher than a predefined threshold.

2. The system of claim 1, wherein execution of the machine executable instructions further causes the processor to determine further subsets of values and to repeat steps d) and e) for each further subset of the further subsets.

3. The system of claim 2, wherein the subsets are non-overlapping subsets.

4. The system of claim 1, the M dimensional acquired data being 3D k-space data (M=3), wherein the selected dimension (K=1) is a read-out direction, wherein the set of M−1 dimensional arrays are representing a respective set of 2D slices.

5. The system of claim 1, the subset of values comprising a predefined odd number of values.

6. The system of claim 1, determining the subset of values comprising identifying a center value along the selected dimension and two or more surrounding values of the center value, the subset comprising the center value and the surrounding values.

7. The system of claim 1, the trained machine learning model being a deep neural network, DNN, model.

8. A magnetic resonance imaging, MRI, system comprising the system of claim 1, the MRI system being configured to acquire M dimensional data.

9. A method comprising:
providing a trained machine learning model, the trained machine learning model being configured for reconstructing images from input k-space data;
receiving a M dimensional multidimensional array comprising M dimensional acquired data;
determining at least one subset of values of at least one selected dimension of the M dimensional array;
for each value of each subset of the at least one subset determining (207) an M−K dimensional array with K≥1 comprising the acquired data corresponding to the value, resulting in a set of M−K dimensional arrays;
inputting the set of M−K dimensional arrays to the trained machine learning model, and receive a reconstructed image from the trained machine learning model and
determine the subset of values so that the correlation between the M−K dimensional array associated with a center value of the subset and the remaining M−K dimensional arrays of the set is higher than a predefined threshold.

10. A computer program product comprising machine executable instructions for execution by a processor, wherein execution of the machine executable instructions causes the processor to perform the method of claim 9.

* * * * *